United States Patent
Ngai et al.

(10) Patent No.: US 6,451,686 B1
(45) Date of Patent: *Sep. 17, 2002

(54) CONTROL OF SEMICONDUCTOR DEVICE ISOLATION PROPERTIES THROUGH INCORPORATION OF FLUORINE IN PETEOS FILMS

(75) Inventors: Chris Ngai, Burlingame, CA (US); Joel Glenn, Little Elm, TX (US); Mei Yee Shek, Burlingame; Judy Huang, Los Gatos, both of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/923,501

(22) Filed: Sep. 4, 1997

(51) Int. Cl.[7] .......................................... A01L 21/4763

(52) U.S. Cl. ...................................... 438/623; 438/784

(58) Field of Search .............................. 438/624, 623, 438/789, 597, 784, 758, 778, 905; 118/715, 716, 728

(56) References Cited

U.S. PATENT DOCUMENTS

| | | | | |
|---|---|---|---|---|
| 4,300,989 A | * | 11/1981 | Chang | 438/771 |
| 4,851,370 A | | 7/1989 | Doklan et al. | 437/225 |
| 4,872,947 A | | 10/1989 | Wang et al. | 156/643 |
| 4,894,352 A | | 1/1990 | Lane et al. | 437/238 |
| 5,013,691 A | | 5/1991 | Lory et al. | 437/238 |

(List continued on next page.)

FOREIGN PATENT DOCUMENTS

| | | | |
|---|---|---|---|
| EP | 0 360 504 A2 | 3/1990 | H01L/29/788 |
| EP | 0 624 899 A2 | 11/1994 | H01L/21/34 |
| EP | 0 624 899 A3 | 11/1994 | H01L/21/34 |
| EP | 0 633 605 A2 | 1/1995 | H01L/21/316 |
| EP | 0 666 340 A1 | 8/1995 | C23C/16/44 |
| EP | 0822 585 A2 | 2/1996 | H01L/21/316 |
| EP | 0 724 286 A1 | 7/1996 | H01L/21/316 |
| JP | 61-276977 | 12/1986 | C23C/16/50 |
| JP | 2-077127 | 3/1990 | H01L/21/314 |
| JP | 4-239750 | 8/1992 | H01L/21/90 |
| JP | 4-341568 | 11/1992 | C23C/16/40 |
| JP | 07-22329 A | 1/1995 | H01L/21/205 |
| JP | 07-29975 A | 1/1995 | H01L/21/768 |
| WO | WO 92/20833 | 11/1992 | C23C/16/00 |

OTHER PUBLICATIONS

Wolf, S., Tauber R.N.; Silicon Processing for the VLSI Era vol. 1: Process Technology, Lattice Press, Sunset Beach, CA, 1986, p. 162.*

(List continued on next page.)

*Primary Examiner*—John F. Niebling
*Assistant Examiner*—Christopher Lattin
(74) *Attorney, Agent, or Firm*—Townsend & Townsend & Crew (57) ABSTRACT

A method and apparatus for reducing oxide traps within a silicon oxide film by incorporating a selected level of fluorine in the silicon oxide film. The method includes the steps of distributing a fluorine source to a processing chamber at a selected rate with the rate being chosen according to the desired level of fluorine to be incorporated into the film, flowing a process gas including a silicon source, an oxygen source and the fluorine source into the processing chamber, and maintaining a deposition zone within the chamber at processing conditions suitable to deposit a silicon oxide film having the selected level of fluorine incorporated into the film over a substrate disposed in the chamber. In a preferred embodiment, the selected level of fluorine incorporated into the film is between $1 \times 10^{20}$ atoms/cm$^3$ and $1 \times 10^{21}$ atoms/cm$^3$. In another preferred embodiment the silicon oxide film is deposited as a first layer of a composite layer premetal dielectric film.

36 Claims, 7 Drawing Sheets

U.S. PATENT DOCUMENTS

| | | | |
|---|---|---|---|
| 5,156,881 A | 10/1992 | Okano et al. | 427/572 |
| 5,215,787 A | 6/1993 | Homma | 427/248.1 |
| 5,275,977 A | 1/1994 | Otsubo et al. | 437/235 |
| 5,288,518 A | 2/1994 | Homma | 427/255 |
| 5,314,724 A | 5/1994 | Tsukune et al. | 427/489 |
| 5,319,247 A | 6/1994 | Matsuura | 257/760 |
| 5,334,552 A | 8/1994 | Homma | 437/195 |
| 5,372,951 A * | 12/1994 | Anjun et al. | 438/440 |
| 5,385,763 A | 1/1995 | Okano et al. | 427/572 |
| 5,399,529 A | 3/1995 | Homma | 437/195 |
| 5,403,630 A | 4/1995 | Matsui et al. | 427/583 |
| 5,405,805 A * | 4/1995 | Homma | 438/623 |
| 5,407,529 A | 4/1995 | Homma | 156/643 |
| 5,413,967 A | 5/1995 | Matsuda et al. | 437/235 |
| 5,420,075 A | 5/1995 | Homma et al. | 437/195 |
| 5,429,995 A | 7/1995 | Nishiyama et al. | 437/238 |
| 5,558,717 A * | 9/1996 | Zhao et al. | 118/715 |
| 5,571,578 A * | 11/1996 | Kaji et al. | 438/789 |
| 5,599,726 A * | 2/1997 | Pan | 438/304 |
| 5,629,238 A | 5/1997 | Choi et al. | 438/645 |
| 5,641,581 A * | 6/1997 | Nishiyama et al. | 428/688 |
| 5,661,334 A * | 8/1997 | Akram | 257/632 |
| 5,661,335 A * | 8/1997 | Anjum et al. | 257/647 |
| 5,672,525 A * | 9/1997 | Pan | 438/505 |
| 5,750,211 A * | 5/1998 | Weise et al. | 427/571 |
| 5,759,906 A * | 6/1998 | Lou | 438/623 |
| 5,814,863 A * | 9/1998 | Pan | 257/346 |
| 5,827,785 A * | 10/1998 | Bhan et al. | 438/784 |
| 5,849,092 A * | 12/1998 | Xi et al. | 134/1.1 |
| 5,858,869 A * | 1/1999 | Chen et al. | 438/597 |
| 5,866,932 A * | 2/1999 | Ymazaki et al. | 257/347 |
| 5,869,149 A * | 2/1999 | Denison et al. | 427/579 |

OTHER PUBLICATIONS

Wolf, S., Tauber R.N.; Silicon Processing for the VLSI Era vol. 1: Process Technology, Lattice Press, Sunset Beach, CA, 1986, p.p. 198–199.*

Robles et al., "Effects of RF Frequency and Deposition Rates on the Moisture Resistance of PECVD TEOS–Based Oxide Films", vol. 92–1, ECS Extended Abstracts, p. 215, Abstract 129, May 1992.

Galiano et al., "Stress–Temperature Behavior of Oxide Films Used For Intermetal Dielectric Applications", VMIC Conference, Jun. 1992, pp. 100–106.

Fukada et al., "Preparation Of SiOF Films With Low Dielectric Constant By ECR Plasma CVD", DUMIC Conference, Feb. 1995, pp. 43–49.

Qian et al., "High Density Plasma Deposition And Deep Submicron Gap Fill With Low Dielectric Constant SIOF Films", DUMIC Conference, Feb. 1995, pp. 50–56.

Matsuda et al., "Dual Frequency Plasma CVD Fluorosilicate Glass Deposition for 0.25 $\mu$m Interlevel Dielectrics", DUMIC Conference, Feb. 1995, pp. 22–28.

Ravi K. Laxman, "Lowe $\epsilon$ Dielectrics: CVD Fluorinated Silicon Dioxides", Semiconductor International, May 1995, pp. 71–74.

Hayasaka et al., "High–Quality And Low Dielectric Constant $SiO_2$ CVD Using High Density Plasma", Dry Process Symposium, Nov. 1994, pp. 163–168.

Yu et al., "Step Coverage Study of Peteos Deposition For Intermetal Dielectric Applications", VMIC Conference, Jun. 1990, 166–172.

Chang et al., "Frequency Effects and Properties of Plasma Deposited Fluorinated Silicon Nitride", J. Vac. Sci. Technol. B6 (2) 1988, pp. 524–532.

Webb et al., "Silicon Dioxide Films Produced By PECVD of TEOS and TMCTS", Proceedings of the Int. Symp. on Ultra Large Scale Integration Science and Technology, No. 9, 1989, Pennington, N.J., pp. 571–585.

Hoff et al., "Thermal Oxidation Of Silicon In An Afterglow Gas", (undated), Ctr. for Elect. Materials and Devices, Penn State Univ.

J. Song et al., "High Quality Fluorinated Silicon Oxide Films Prepared By Plasma Enhanced Chemical Vapor Deposition at 120° C.," Appl. Phys. Lett., vol. 69, No. 13, pp. 1876–1878 (Sep. 1996).

Shapiro et al., "Dual Frequency Plasma CVD Fluorosilicate Glass Water Absorption And Stability", DUMIC Conference, Feb. 1995, pp. 118–123.

Takeishi et al., "Stabilizing Dielectric Constants of Fluorine–Doped–SiO2 Films by N20–Plasma Annealing", DUMIC Conference, Feb. 1995, pp. 257–259.

Carl et al., "The Effect of $O_2:C_2F_6$ Ratios and Low Frequency Power On The Gap Fill Properties And Stability Of F–TEOS Films", DUMIC Conference, Feb. 1995, pp. 234–240.

Musaka et al., "Single Step Gap Filling Technology For Subhalf Micron Metal Spacings On Plasma Enhanced $TEOS/O_2$ Chemical Vapor Deposition System", Extended Abstracts of the 1993 International Conference on Solid State Devices and Materials, Makuhari, 1993, pp. 510–512.

U.S. patent application Ser. No. 08/691,983, Nowak et al., filed Aug. 2, 1996.

* cited by examiner

CONTROL OF SEMICONDUCTOR DEVICE ISOLATION PROPERTIES THROUGH INCORPORATION OF FLUORINE IN PETEOS FILMS

BACKGROUND OF THE INVENTION

The present invention relates to the deposition of dielectric layers during wafer processing, and more specifically, to a method and apparatus for depositing a silicon oxide film having reduced bulk oxide traps within the film. Silicon oxide films deposited according to the present invention are particularly useful as an initial lining layer in composite layer premetal dielectric films but are also useful in other applications.

Chemical vapor deposition (CVD) of silicon oxide films is one of the primary steps in the fabrication of many modern semiconductor devices. Such silicon oxide films are widely used as insulating layers between adjacent metal layers, between a silicon substrate and an initial metal layer, between the silicon substrate and a polysilicon or metal gate structure and as oxide sidewalls among many other uses. One particular use for a silicon oxide film is as an initial layer in a composite layer film that separates the polysilicon gate/interconnect layer and the first metal layer of MOS transistors. Such separation layers are referred to as premetal dielectric (PMD) layers because they are typically deposited before any of the metal layers in a multilevel metal structure.

Figure 1:
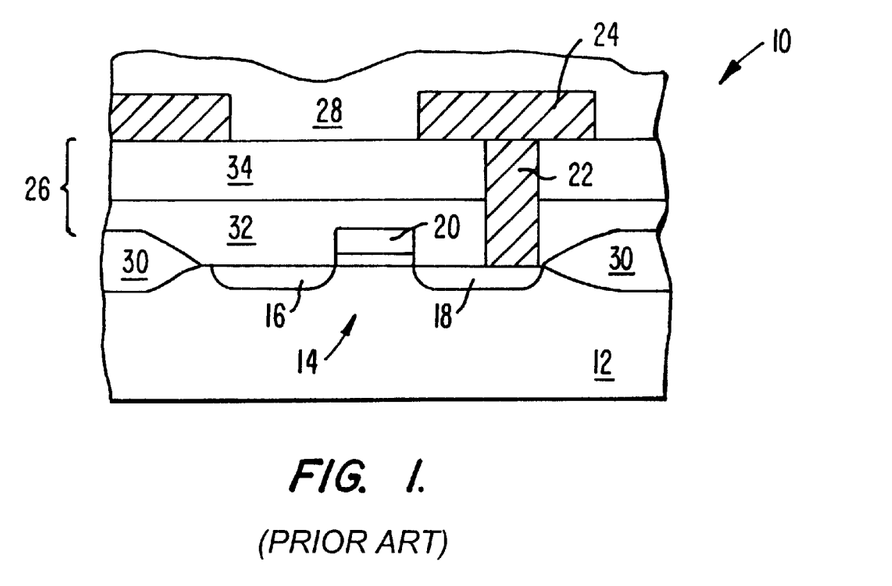
FIG. 1 is a cross sectional view of a simplified prior art integrated circuit that includes a premetal dielectric layer.

An example of a PMD layer is shown in FIG. 1, which is a simplified cross-sectional view of a partially completed prior art integrated circuit 10. In FIG. 1, a transistor 14 is fabricated on the surface of a silicon substrate 12. Transistor 14 includes a source region 16, a drain region 18 and a gate region 20. A metal contact 22 connects an overlying metal line 24 to drain region 18, while a PMD layer 26 separates metal line 24 from polysilicon gate 20 and silicon substrate 12 (except for at contact 22). Also shown in FIG. 1 is a first layer 28 of a composite layer intermetal dielectric film that separates metal layer 24 from overlying metal layers (not shown), and field oxide (FOX) regions 30, which separate and electrically isolate transistor 14 from other devices fabricated on substrate 12.

As shown in FIG. 1, PMD layer 26 is a composite layer film including a first silicon oxide layer 32 and a second borophosphosilicate glass (BPSG) layer 34. Silicon oxide layer 32 is deposited over a surface that contains raised or stepped structures (e.g., gate 20 and FOX regions 30). As initially deposited, layer 32 generally conforms to the topography of the underlying surface and is typically planarized or flattened to achieve the shape shown in FIG. 1 before overlying layer 34 is deposited. One way to planarize silicon oxide layer 32 is to deposit a photoresist layer (a nonconformal layer) over the film and etchback the photoresist/silicon oxide combination.

After layer 32 is planarized, BPSG layer 34 is then deposited over layer 32. BPSG layer 34 may then be further planarized or flattened before an overlying metal layer is deposited. Several different techniques may be used to planarize BPSG layer 32. For example, a standard reflow process, in which the BPSG film is heated to a temperature at which it flows, may be employed to planarize the film. Alternatively, a chemical mechanical polishing (CMP) or etching technique may be used. As an example of this method in fabrication devices having minimum feature sizes of 0.5 $\mu$m, silicon oxide layer 34 may be 9000 Å as initially deposited, but then be etched back to be only 3000 Å thick, while BPSG layer 34 may be 5000 Å thick.

In depositing such a PMD layer, it is important that the physical and electrical properties of the layer be within specified ranges as determined by the semiconductor manufacturer. Such importance cannot be overstated because these properties directly effect the electrical characteristics and operation of the transistors and other structures formed on the substrate, which in turn directly effect the operation of the semiconductor device or integrated circuit. Two such electrical characteristics of fabricated transistors and diodes include the breakdown voltage and leakage current of the structures. If these characteristics are not within the manufacturer's specifications, the integrated circuit containing the transistors and/or diodes may be defective.

One known method of depositing silicon oxide layer 32 described above includes flowing a process gas containing tetraethylorthosilicate (TEOS) and $O_2$ into a P5000 lamp-heated CVD deposition chamber manufactured by Applied Materials, the assignee of the present invention. In this method, the process gas is introduced into the CVD chamber through an anodized aluminum faceplate, and a plasma is formed between the faceplate and a susceptor upon which a substrate rests by applying RF energy to the faceplate. As is usual in deposition processes of this type, in addition to depositing a silicon oxide film over the substrate, the process gas causes unwanted deposition on areas such as the interior walls of the processing chamber. Unless removed, this unwanted deposition is a source of contaminate particles that may interfere with subsequent processing steps and adversely effect wafer yield.

To avoid such problems in this known method, the inside surface of the chamber is regularly cleaned after processing n wafers (where n is generally between 1–8 depending on the thickness of the deposited film) to remove the unwanted deposition material from the chamber walls. To perform such a cleaning operation, a fluorine-containing gas, such as nitrogen trifluorine ($NF_3$), is used to remove (etch) the deposited material from the chamber walls and other areas. The etchant gas is introduced into the chamber and a plasma is formed so that the etchant gas reacts with and removes the deposited material from the chamber walls. Such a process (deposition step and clean step combination) has been successfully used to deposit silicon oxide layers 32 of PMD layers such as layer 26 in the fabrication of many different types of integrated circuits.

In the semiconductor fabrication field, new technology is constantly being developed to allow for the deposition of silicon oxide and other films having improved properties. One example of such improved technology is the development of the DxZ chamber by Applied Materials, the assignee of the present invention. The DxZ chamber, which is further described in U.S. Pat. No. 5,558,717, allows for improved film deposition for some processes as compared to prior art deposition chambers. Sometimes, processes that were successfully implemented on older technology equipment, however, are not ideally suited for such newer equipment. For example, when the process described above to deposit silicon oxide layer 32 was attempted on a DxZ chamber, an increased level of bulk oxide traps were created within the deposited silicon oxide film. In some instances, the increased number of such bulk oxide traps was sufficient to lower the breakdown voltage and increase the current leakage of transistor and diode devices fabricated with such films to unacceptable levels.

Accordingly, new deposition techniques are continuously being sought to better use newly developed technology.

SUMMARY OF THE INVENTION

The present invention provides an improved method for depositing silicon oxide dielectric layers having reduced oxide trapped charges within the bulk layer of the deposited film. Bulk oxide traps are reduced by adding a chemical source to the deposition process to create interactions with the silicon oxide film being deposited that reduce the bulk oxide traps within the film. The chemical source selected is one that promotes such bulk oxide trap reducing interactions. Examples of such a chemical source include fluorine-containing sources such as $NF_3$, $C_2F_6$, $CF_4$ and $F_2$ among other chemical sources.

One embodiment of the method of the present invention includes the steps of distributing a fluorine source to a processing chamber at a selected rate with the rate being chosen to incorporate between about $1 \times 10^{19}$ atoms/cm$^3$ and $3 \times 10^{21}$ atoms/cm$^3$ of fluorine into the film; flowing a process gas including a silicon source, an oxygen source and the fluorine source into the processing chamber; and maintaining a deposition zone within the chamber at processing conditions suitable to deposit, over a substrate disposed in the chamber, a silicon oxide film having the desired level of fluorine incorporated therein. In a preferred version of this embodiment, the desired level of fluorine incorporated into the film is between about $5 \times 10^{19}$ atoms/cm$^3$ and $1 \times 10^{21}$ atoms/cm$^3$. In an even more preferred embodiment, the fluorine level is between $1 \times 10^{20}$ atoms/cm$^3$ and $1 \times 10^{21}$ atoms/cm$^3$.

In another embodiment of the present invention, a method is disclosed for fabricating an integrated circuit. In this embodiment, transistors are formed upon the surface of a substrate. Afterwards, but prior to depositing any metal layers over the substrate, a first, silicon oxide layer of a composite dielectric layer is deposited over the substrate from a process gas that includes a silicon source, an oxygen source and a fluorine source. The amount of fluorine source in the process gas is selected to deposit a film having between $1 \times 10^{19}$ and $3 \times 10^{21}$ fluorine atoms/cm$^3$ within the film. Next, a second layer of the composite layer dielectric layer is deposited over the first layer. In a preferred version of this embodiment, the second layer of the composite layer is a BPSG film and the fluorine content of the first layer is between about $5 \times 10^{19}$ atoms/cm$^3$ and $1 \times 10^{21}$ atoms/cm$^3$. In an even more preferred embodiment the fluorine content of the first layer is between $1 \times 10^{20}$ atoms/cm$^3$ and $1 \times 10^{21}$ atoms/cm$^3$.

For a further understanding of the objects and advantages of the present invention, reference should be made to the ensuing detailed description taken in conjunction with the accompanying drawings.

DETAILED DESCRIPTION OF THE PREFERRED EMBODIMENTS

I. Reducing Bulk Oxide Traps

As described above, prior to the present invention it was known to deposit a composite PMD layer that included an underlying silicon oxide layer and an overlying BPSG film. One particular method of depositing the silicon oxide layer in such a composite film was with a PECVD process in which a plasma was formed from a process gas of TEOS and $O_2$. As also described above, this technique has been successfully used in the fabrication of a variety of different types of integrated circuits that included diodes and transistors. In the fabrication of some of these circuits, the process was optimized so that the breakdown voltage and leakage current of selected diodes and transistors fabricated in the circuit were controllable within specified ranges.

It was discovered, however, that when the above-described silicon oxide deposition process was implemented in a DxZ chamber the breakdown voltage of certain diodes and transistors created as part of a sequence of steps in the fabrication of an integrated circuit including many different transistors and diodes was significantly lower than that of diodes and transistors fabricated using almost identical steps except for the silicon oxide layer being deposited in the lamp-heated chamber. It was also discovered that the leakage current of those same diodes and transistors was higher for those having silicon oxide layers deposited in the DxZ chamber as compared to the lamp-heated chamber. In some instances, these differences represent values outside of acceptable manufacturing ranges.

After many failed efforts at identifying the cause of this problem, the inventors of the present invention discovered that the fluorine level of the silicon oxide layer films deposited in the lamp-heated chamber was significantly higher than the fluorine level of the silicon oxide lining layers deposited in the DxZ chamber (e.g., $8 \times 10^{19}$ atoms/cm$^3$ as compared to $1 \times 10^{18}$ atoms/cm$^3$). The inventors then further discovered that the source of the additional fluorine in the lamp-heated films was from fluorine ions and atoms trapped within the anodized aluminum faceplate used in the lamp-heated chamber. It is believed that these fluorine ions were ones initially generated during the plasma clean step.

It is further believed that when fluorine atoms are bonded into the silicon oxide film at these levels, the atoms are bonded in the form of relatively strong Si—OF and Si—HF bonds and that these bonds tend to displace relatively weak Si—H and H—OH hydrogen bonds within the oxide film. Such Si—H and H—OH bonds are dangling bonds that can be the source of bulk oxide trapped charges, which in turn leads to the decrease in breakdown voltage of discrete components fabricated from such films. Thus, it is believed that the additional fluorine atoms incorporated into the lamp-heated silicon oxide films were sufficient to keep the number of bulk oxide trapped charges within acceptable levels for the application discussed.

A similar clean step was used with the deposition process in the DxZ chamber. It is believed that insignificant amounts of fluorine were incorporated into this deposited oxide layer, however, because the surface porosity of the bare aluminum faceplate in the DxZ chamber, provided a surface area about two orders of magnitude less than the surface area of the anodized aluminum faceplate of the lamp-heated chamber. With such a significantly smaller surface area exposed to the cleaning plasma during a clean step, less fluorine is trapped within the bare aluminum faceplate resulting in a significantly smaller source of fluorine atoms available to react with a silicon oxide film deposited within the chamber. This in turn results in fewer fluorine atoms passivating dangling Si—H bonds within the film and a relatively high number of bulk oxide traps in the film. This problem is particularly noticeable in PMD layers because such layers are exposed to high temperature anneal and reflow steps that are not used in the deposition of intermetal dielectric or passivation layers.

Figure 2:
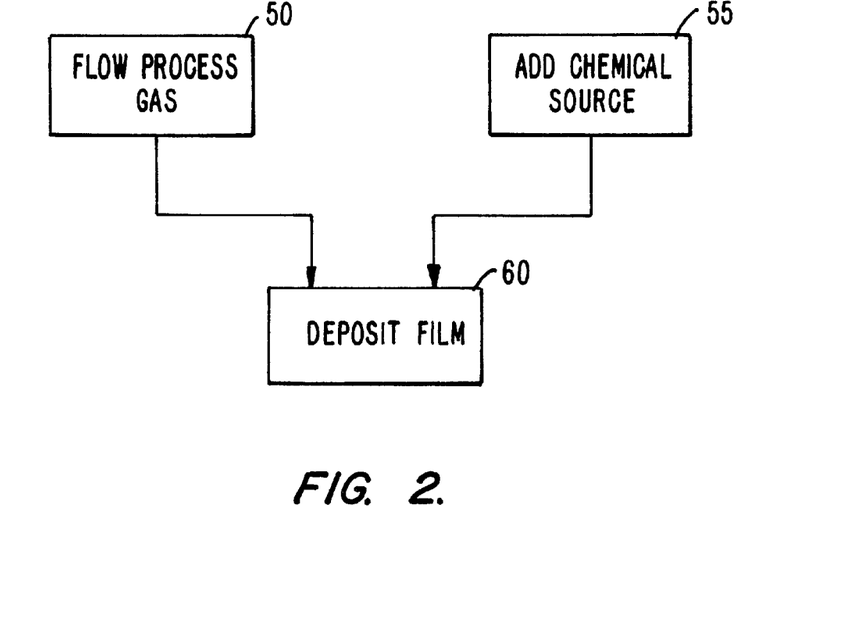
FIG. 2 is a flowchart illustrating one embodiment of the method of the present invention.

The present inventors developed a method of reducing the oxide trapped charges by increasing the fluorine content of the film even when a source of fluorine (e.g., an anodized aluminum faceplate combined with a fluorine clean operation) does not exist. This method of reducing oxide charge traps is illustrated in FIG. 2. As shown in FIG. 2 a chemical source (e.g., a fluorine source) is added to the deposition zone of the chamber (step 55) along with the flow of a process gas employed to deposit a silicon oxide film (step 50). The deposition zone is then maintained at conditions suitable to deposit a silicon oxide layer as shown in step 60. The addition of the fluorine source to the deposition zone adds additional fluorine to the reaction which in turn results in fewer dangling Si—H and H—OH bonds and an increased number of more desirable Si—OF and Si—HF bonds. As discussed above, dangling bonds such as Si—H and H—OH bonds are believed to be the source of bulk oxide traps so the reduction of these bonds ultimately results in a reduction of bulk oxide traps.

In a preferred embodiment, additional fluorine is incorporated into the film by flowing a relatively small amount of a fluorine-containing source gas, e.g., $NF_3$, into the chamber along with the process gas used to deposit the silicon oxide film (i.e., silicon and oxygen sources). It is important to precisely control the amount of fluorine flowed into the process gas in this process. If too little fluorine is flowed into the chamber, the benefits of the present invention will not be achieved. Conversely, if too much fluorine is flowed into the chamber, the amount of fluorine incorporated into the deposited film could result in fluorine leaking from the silicon oxide layer into the gate of an underlying transistor or into a neighboring metal line or contact and/or could result in boron diffusing from the overlying BPSG layer into the gate. Incorporating too much fluorine is also undesirable in that other film characteristics (e.g., the dielectric constant) will change. The dielectric constant of silicon oxide films is generally between 4.0 and 4.2. In most applications of the present invention it will be preferable to keep the dielectric constant of the film at between about 3.9 and 4.2. To this end, the inventors have discovered that the amount of fluorine incorporated into the film is generally between about $1 \times 10^{19}$ atoms/cm$^3$ and $3 \times 10^{21}$ atoms/cm$^3$. Preferably the fluorine level is between about $5 \times 10^{19}$ atoms/cm$^3$, and $1 \times 10^{21}$ atoms/cm$^3$ and even more preferably, the amount of fluorine incorporated into the film should be between $1 \times 10^{20}$ atoms/cm$^3$ and $1 \times 10^{21}$ atoms/cm$^3$.

To achieve these levels in the DxZ chamber with a bare aluminum faceplate, a flow of between 1–30 sccm of $NF_3$, and more preferably between 5–20 sccm of $NF_3$, may be introduced into the chamber along with the regular process gas used to deposit a silicon oxide film. In one preferred process, a process gas including 1000 mgm of vaporized TEOS mixed with a flow of 1000 sccm $O_2$, 15 sccm of $NF_3$ and 1000 sccm of helium is introduced into the chamber. Chamber temperature is set at 400° C., chamber pressure is set and maintained at 8.2 torr, the susceptor is placed 280 mils from the faceplate and a 13.56 MHz RF is signal supplied to the faceplate at 910 Watts to initiate the plasma.

Test measurements indicate that silicon oxide films deposited according to the preferred process described above have a refractive index of 1.46, a uniformity level of 1.5%, a stress level of about $1.0 \times 10^{-9}$ dynes/cm$^2$ and a deposition rate of about 7550 Å/min. In one PMD application for 0.5 $\mu$m feature size devices, the silicon oxide film of the present invention is deposited to a thickness of between 5,000 to 12,000 Å, covered with photoresist and then etched-back to between 2,000 to 4,000 Å. A BPSG layer of between 4,000 to 8,000 Å is then deposited over the silicon oxide layer and reflowed to complete the composite PMD layer.

The amount of fluorine that is added to the process gas to incorporate a selected amount of fluorine into the film will vary if other process chemistries, other processing conditions, other fluorine sources or other chamber types are used. For example, the ionization efficiency of the DxZ chamber referred to above is about 30% when a 910 W 13.56 MHz RF signal is employed to form a plasma. If another chamber type employing microwave source was used, ionization efficiency could be as high as 99%. In such a chamber, less fluorine would be required than in the DxZ chamber. Also, if $F_2$ was used as a fluorine source instead of $NF_3$, less $F_2$ would be required because $F_2$ is a very volatile gas that is relatively easy to dissociate.

As an additional variable, the above gas introduction rates are based on a resistively heated DxZ DCVD chamber manufactured by Applied Materials that is outfitted for 8-inch substrates. The actual rates at which gases are introduced in other embodiments will vary if other chambers of different designs and/or volume are employed. A more detailed description of such a DxZ deposition chamber is described below for reference and illustration. It is to be understood that the present invention is not limited to such a chamber, and in fact, the present inventors have found that the present invention in applicable to further improving silicon oxide film quality in other PECVD chambers including the type of lamp-heated CVD chamber described above with an anodized aluminum faceplate and in a DxZ chamber equipped with an anodized aluminum faceplate. Because in such cases, the anodized aluminum acts as one source of additional fluorine, the amount of fluorine specifically flowed into the chamber can be further reduced. The inventors have found that between 1–5 sccm of $NF_3$ to be sufficient for these processes.

In still other embodiments, other steps taken during deposition can effect the amount of fluorine that should be added to the process gas. For example, using a silicon oxide, silicon nitride, or similar seasoning film to cover the interior of a chamber after a cleaning step, may cover some fluorine trapped within the chamber walls and/or faceplate preventing the fluorine from being incorporated into a subsequently deposited silicon oxide. Thus, in such a case, it may be appropriate to use higher fluorine introduction rates even if an anodized faceplate is used that would otherwise act as a relatively large source of fluorine.

II. Exemplary Chamber

Figure 3A:
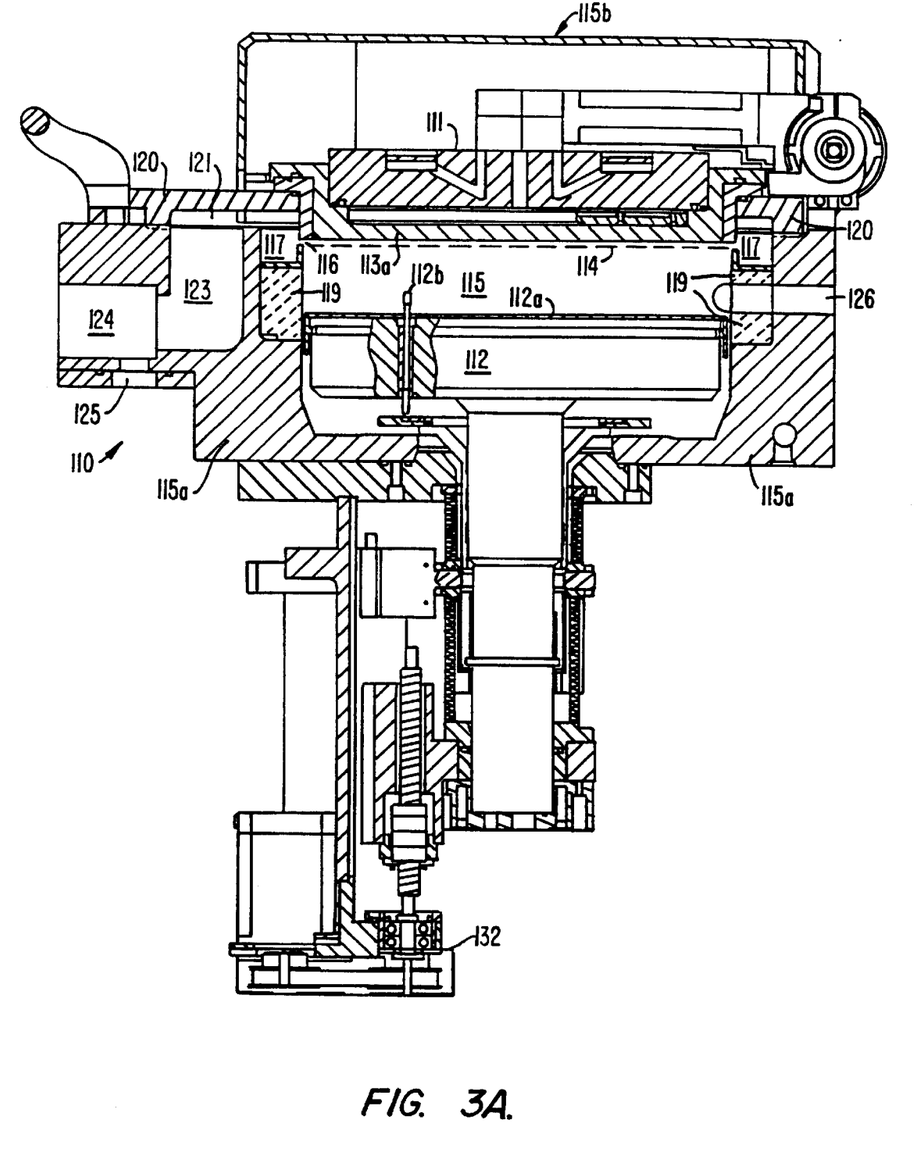
FIGS. 3A and 3B are vertical, cross-sectional view of one embodiment of a chemical vapor deposition apparatus according to the present invention.
Figure 3B:
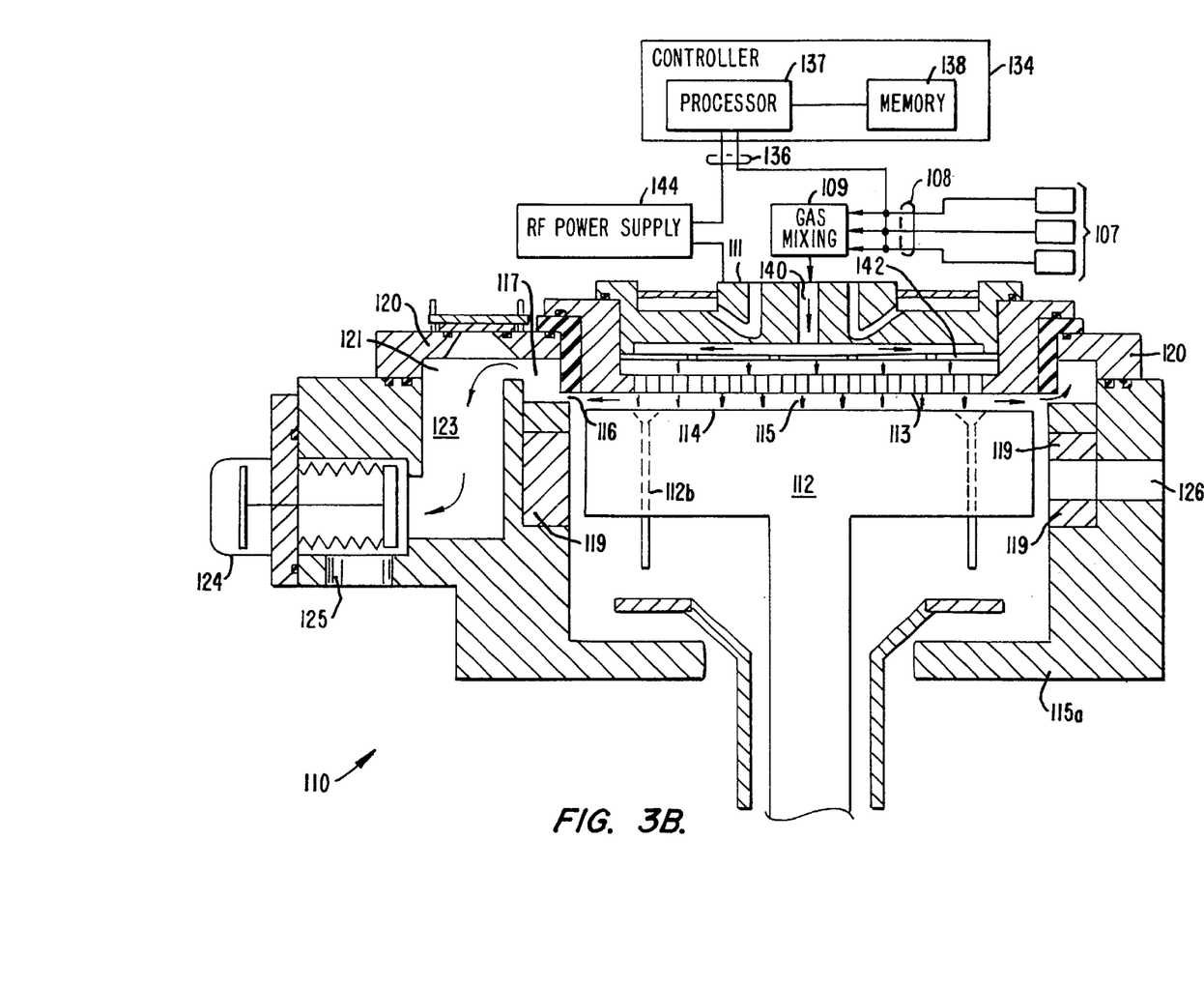
Figure 3C:
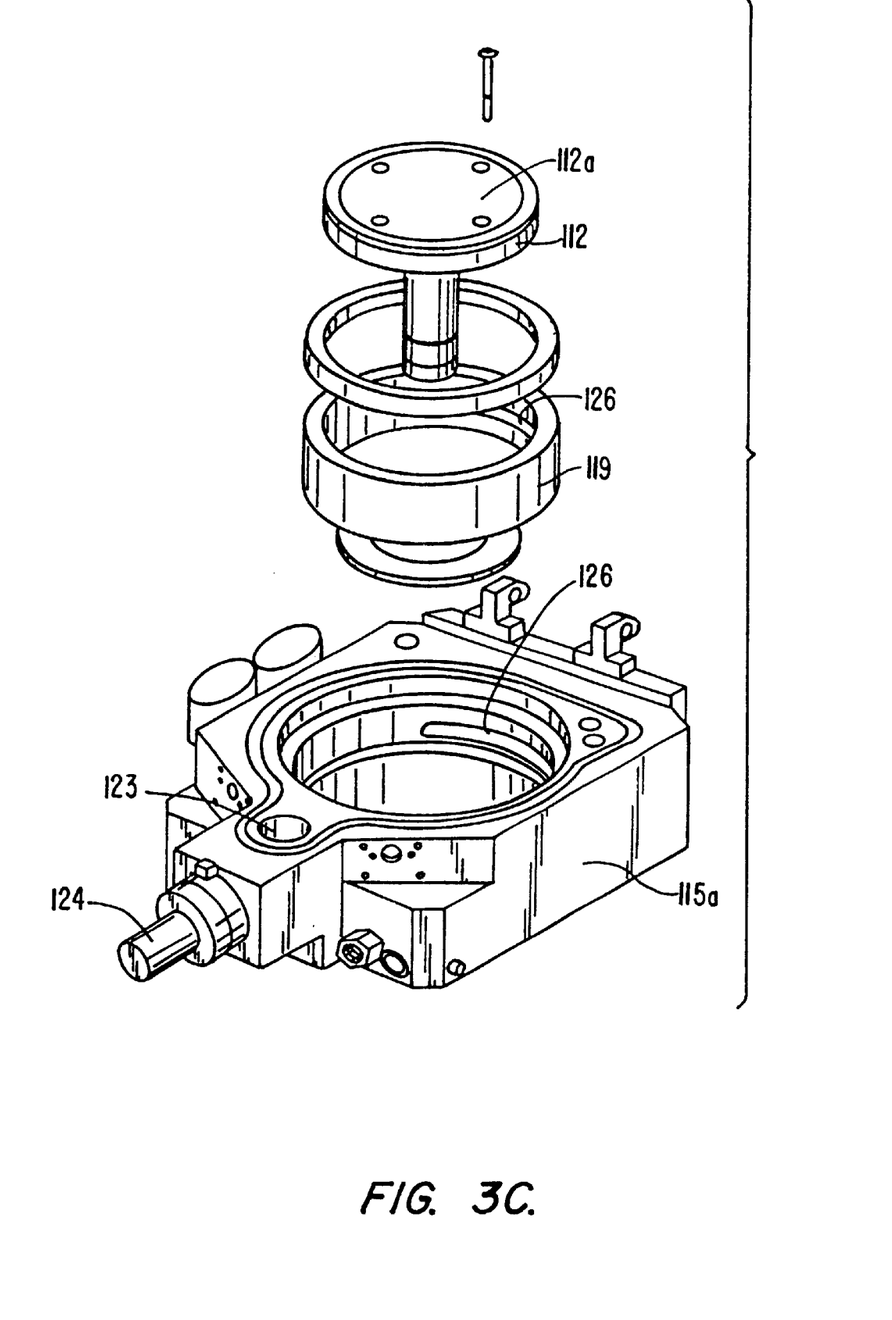
FIGS. 3C and 3D are exploded perspective view of parts of the CVD chamber depicted in FIG. 3A.
Figure 3D:
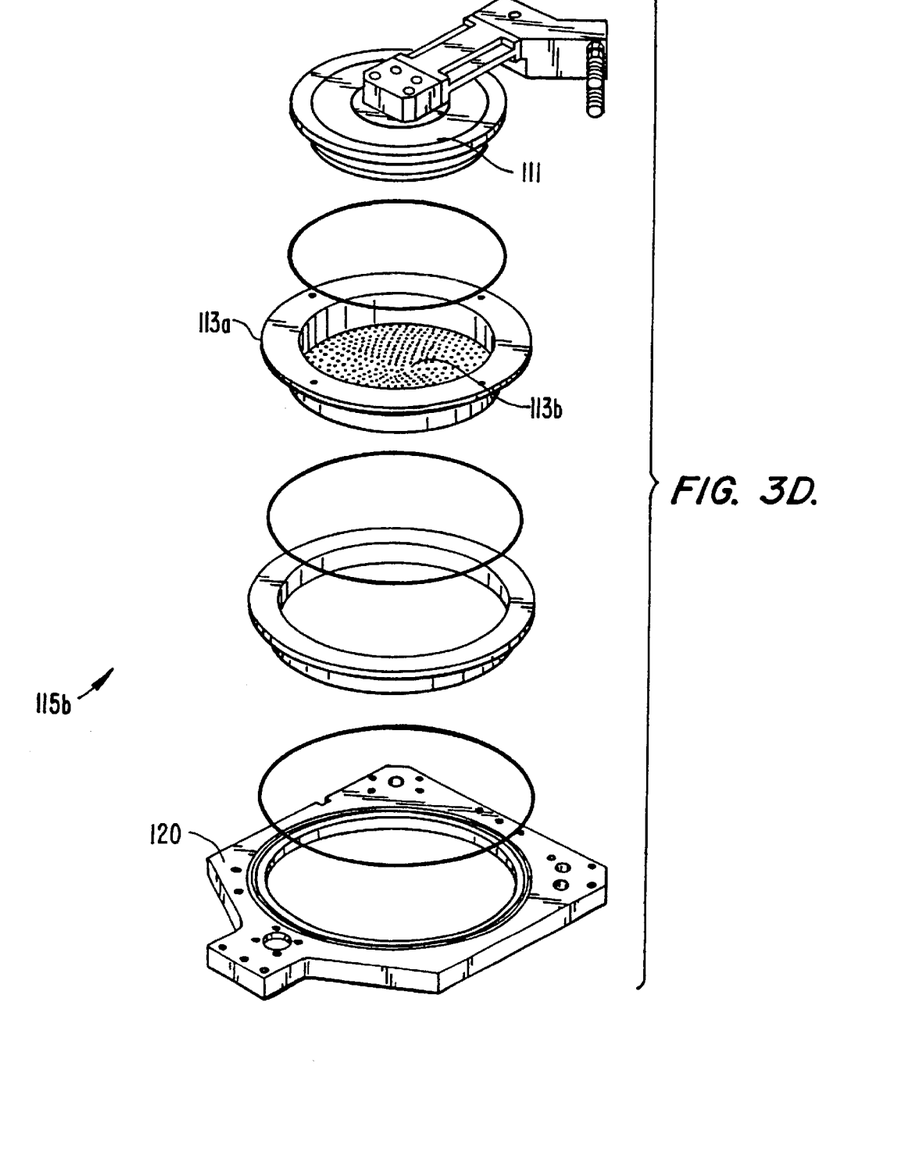

FIGS. 3A and 3B are vertical, cross-sectional views of a DxZ chemical vapor deposition system 110 referred to above. CVD system 110 includes a vacuum or processing chamber 115 having a chamber wall 155*a* and chamber lid assembly 115*b*. Chamber wall 115*a* and chamber lid assembly 115*b* are shown in exploded, perspective views in FIGS. 3C and 3D.

Reactor 110 contains a gas distribution manifold 111 for dispersing process gases to a substrate (not shown) that rests on a heated pedestal 112 centered within the process chamber. During processing, the substrate (e.g. a semiconductor wafer) is positioned on a flat (or slightly convex) surface 112*a* of pedestal 112. The pedestal can be controllably moved between a lower loading/off-loading position (depicted in FIG. 3A) and an upper processing position (indicated by dashed line 114 in FIG. 3A and shown in FIG. 3B) which is closely adjacent to manifold 111. A centerboard (not shown) includes sensors for providing information on the position of the wafers.

Deposition and carrier gases are introduced into chamber 115 through perforated holes 113b (FIG. 10) of a conventional flat, circular gas distribution faceplate 113a. More specifically, deposition process gases flow into the chamber through the inlet manifold 111 (indicated by arrow 140 in FIG. 3B), through a conventional perforated blocker plate 42 and then through holes 113b in gas distribution faceplate 113a. As described above, faceplate 113 is made from bare aluminum in a preferred embodiment, but can be made from anodized aluminum or similar materials in other embodiments.

Before reaching the manifold, deposition and carrier gases are input through gas supply lines 108 into a mixing system 109 where they are combined and then sent to manifold 111. Generally, the supply line for each process gas includes (i) several safety shut-off valves (not shown) that can be used to automatically or manually shut off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in reactor 110 can be either a thermal process or a plasma enhanced process. In a plasma enhanced process, an RF power supply 144 applies electrical power between the gas distribution faceplate 113a and the pedestal so as to excite the process gas mixture to form a plasma within the cylindrical region between the faceplate 113a and the pedestal. (This region will be referred to herein as the "deposition zone"). Constituents of the plasma react to deposit a desired film on the surface of the semiconductor wafer supported on pedestal 112. RF power supply 144 can supply either single or mixed frequency RF power. When mixed frequency RF power is used, RF power supply 144 typically supplies power at a high RF frequency (RF1) of 13.56 MHz and at a low RF frequency (RF2) of 360 KHz to enhance the decomposition of reactive species introduced into the vacuum chamber 115.

During a deposition process, the plasma heats the entire process chamber 110, including the walls of the chamber body 115a surrounding the exhaust passageway 123 and the shutoff valve 124. When the plasma is not turned on, a hot liquid is circulated through the walls 115a of the process chamber to maintain the chamber at an elevated temperature. Fluids used to heat the chamber walls 115a include the typical fluid types, i.e., water based ethylene glycol or oil based thermal transfer fluids. This heating beneficially reduces or eliminates condensation of undesirable reactant products and improves the elimination of volatile products of the process gases and other contaminants which might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 116 surrounding the reaction region and into an annular exhaust plenum 117. The annular slot 116 and the plenum 117 are defined by the gap between the top of the chamber's cylindrical side wall 115a (including the upper dielectric lining 119 on the wall) and the bottom of the circular chamber lid 120. The 360° circular symmetry and uniformity of the slot orifice 116 and the plenum 117 are important to achieving a uniform flow of process gases over the wafer so as to deposit a uniform film on the wafer.

From the exhaust plenum 117, the gases flow underneath a lateral extension portion 121 of the exhaust plenum 117, past a viewing port 122, through a downward-extending gas passage 123, past a vacuum shut off valve 124 (whose body is integrated with the lower chamber wall 115a), and into the exhaust outlet 125 which connects to the external vacuum pump (not shown) through a foreline (also not shown).

The wafer support platter of the pedestal 112 (preferably aluminum) is heated using a double fill turn single loop embedded heater element configured to form parallel concentric circles. An outer portion of the heater element runs adjacent to a perimeter of the support platter while an inner portion runs on the path of a concentric circle having a smaller radius. The wiring to the heater element passes through the stem of the pedestal 112.

Typically, any or all of the chamber lining, gas inlet manifold faceplate, and various other reactor hardware is made out of material such as aluminum or anodized aluminum. An example of such a CVD apparatus is described in a U.S. Pat. Nos. 5,558,717 entitled "CVD Processing Chamber, " issued to Zhao et al. The 5,558,717 patent is assigned to Applied Materials, Inc., the assignee of the present invention, and is hereby incorporated by reference in its entirety.

A lift mechanism and motor 132 raises and lowers the heater pedestal assembly 112 and its wafer lift pins 112b as wafers are transferred into and out of the body of the chamber by a robot blade (not shown) through an insertion/removal opening 126 in the side of the chamber 110. The motor 132 raises and lowers pedestal 112 between a processing position 114 and a lower, wafer-loading position. The motor, valves or flow controllers 120 connected to supply lines 108, gas delivery system, throttle valve 132, RF power supply 144, and chamber and substrate heating systems are all controlled by a system controller 134 over control lines 136 of which only some are shown. Controller 134 relies on feedback from optical sensors to determine the position of moveable mechanical assemblies such as the throttle valve and susceptor which are moved by appropriate motors under the control of controller 134.

In a preferred embodiment, the system controller includes a hard disk drive (memory 138), a floppy disk drive and a processor 137. The processor contains a single board computer (SBC), analog and digital input/output boards, interface boards and stepper motor controller boards. Various parts of CVD system 110 conform to the Versa Modular Europeans (VME) standard which defines board, card cage, and connector dimensions and types. The VME standard also defines the bus structure having a 16-bit data bus and 24-bit address bus.

System controller 134 controls all of the activities of the CVD machine. The system controller executes system control software, which is a computer program stored in a computer-readable medium such as a memory 138. Preferably, memory 138 is a hard disk drive, but memory 138 may also be other kinds of memory. The computer program includes sets of instructions that dictate the timing, mixture of gases, chamber pressure, chamber temperature, RF power levels, susceptor position, and other parameters of a particular process. Of course, other computer programs such as one stored on another memory device including, for example, a floppy disk or other another appropriate drive, may also be used to operate controller 134.

Figure 3E:
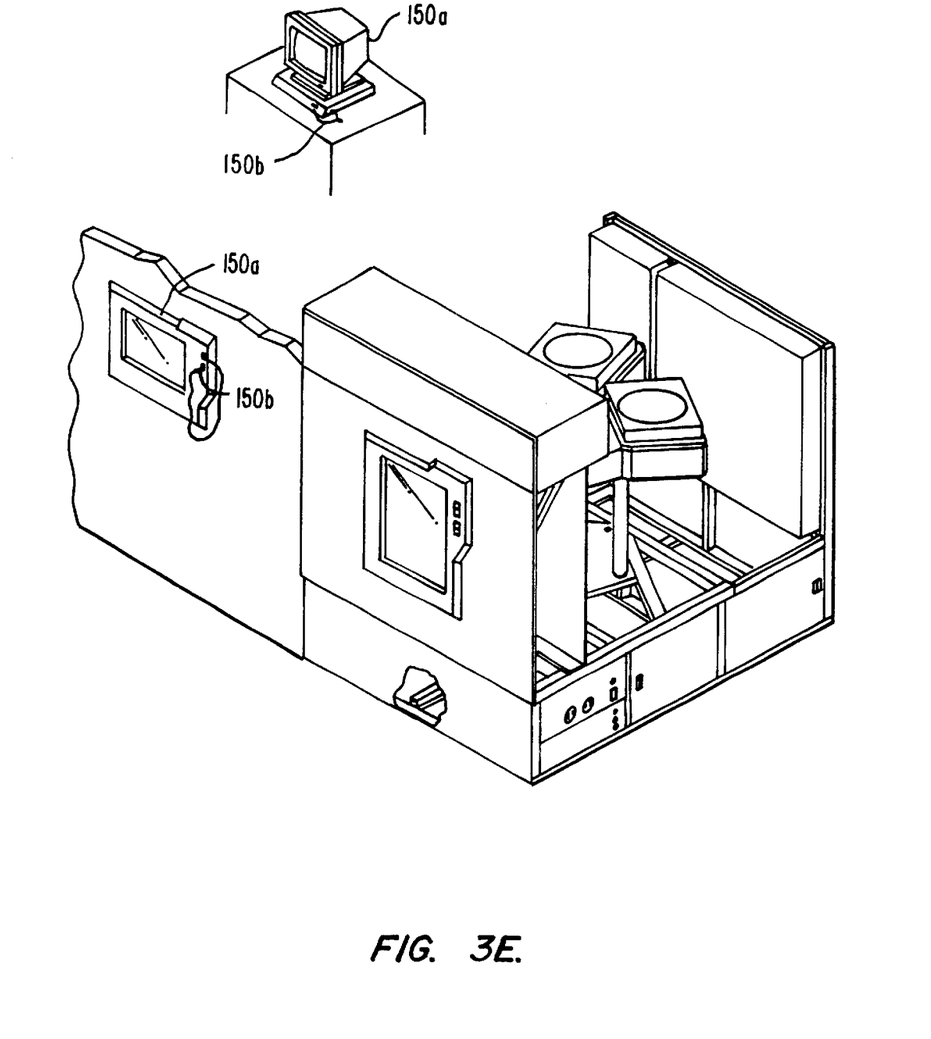
FIG. 3E is a simplified diagram of the system monitor and CVD system of FIGS. 3A and 3B in a multi-chamber system, which may include one or more chambers.

The interface between a user and controller 134 is via a CRT monitor 150a and light pen 150b, shown in FIG. 3E, which is a simplified diagram of the system monitor and CVD system 110 in a multi-chamber system, which may include one or more chambers. In the preferred embodiment two monitors 150a are used, one mounted in the clean room wall for the operators and the other behind the wall for the service technicians. Both monitors 150a simultaneously display the same information, but only one light pen 150b is enabled. The light pen 150b detects light emitted by CRT display with a light sensor in the tip of the pen. To select a particular screen or function, the operator touches a designated area of the display screen and pushes the button on the pen 150b. The touched area changes its highlighted color, or a new menu or screen is displayed, confirming communication between the light pen and the display screen. Of course, other devices, such as a keyboard, mouse, or other pointing or communication device, may be used instead of or in addition to light pen 150b to allow the user to communicate with controller 134.

The process for depositing the film can be implemented using a computer program product that is executed by controller 134. The computer program code can be written in any conventional computer readable programming language, such as, 68000 assembly language, C, C++, Pascal, Fortran, or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 3F:
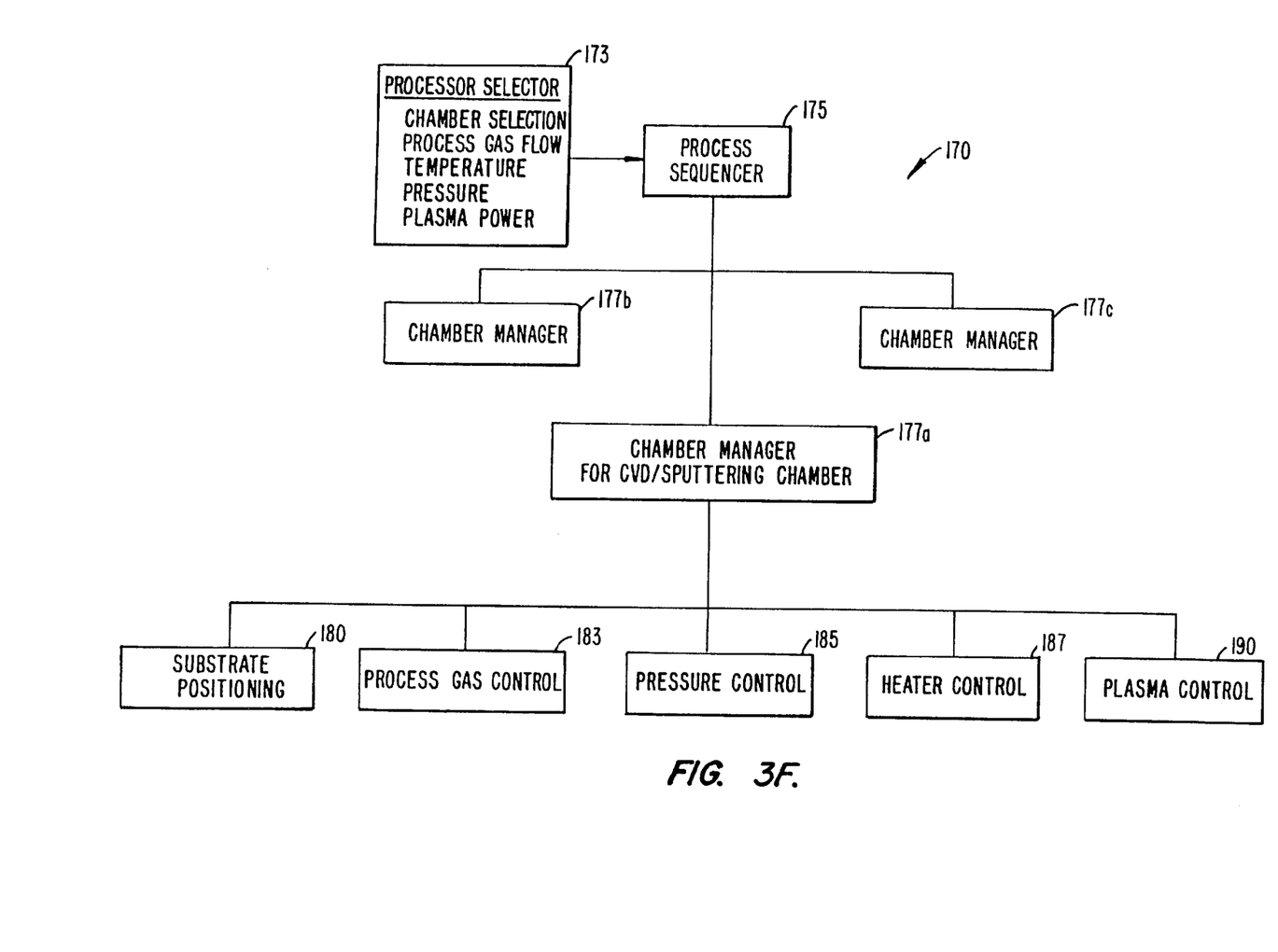
FIG. 3F shows an illustrative block diagram of the hierarchical control structure of the system control software, computer program 170, according to a specific embodiment.

FIG. 3F shows an illustrative block diagram of the hierarchical control structure of the system control software, computer program 170, according to a specific embodiment. A user enters a process set number and process chamber number into a process selector subroutine 173 in response to menus or screens displayed on the CRT monitor by using the light pen interface. The process sets are predetermined sets of process parameters necessary to carry out specified processes, and are identified by predefined set numbers. The process selector subroutine 173 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature and are provided to the user in the form of a recipe. The parameters specified by the process recipe are entered utilizing the light pen/CRT monitor interface.

The signals for monitoring the process are provided by the analog input and digital input boards of the system controller and the signals for controlling the process are output on the analog output and digital output boards of CVD system 110.

A process sequencer subroutine 175 comprises program code for accepting the identified process chamber and set of process parameters from the process selector subroutine 173, and for controlling operation of the various process chambers. Multiple users can enter process set numbers and process chamber numbers, or a user can enter multiple process set numbers and process chamber numbers, so the sequencer subroutine 175 operates to schedule the selected processes in the desired sequence. Preferably the sequencer subroutine 175 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 175 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 175 determines which process chamber and process set combination is going to be executed next, the sequencer subroutine 175 causes execution of the process set by passing the particular process set parameters to a chamber manager subroutine 177a–c which controls multiple processing tasks in a process chamber 115 according to the process set determined by the sequencer subroutine 175. For example, the chamber manager subroutine 177a comprises program code for controlling sputtering and CVD process operations in the process chamber 115. The chamber manager subroutine 177 also controls execution of various chamber component subroutines which control operation of the chamber components necessary to carry out the selected process set. Examples of chamber component subroutines are substrate positioning subroutine 180, process gas control subroutine 183, pressure control subroutine 185, heater control subroutine 187, and plasma control subroutine 190. Those having ordinary skill in the art would readily recognize that other chamber control subroutines can be included depending on what processes are desired to be performed in the process chamber 115. In operation, the chamber manager subroutine 177a selectively schedules or calls the process component subroutines in accordance with the particular process set being executed. The chamber manager subroutine 177a schedules the process component subroutines similarly to how the sequencer subroutine 175 schedules which process chamber 115 and process set is to be executed next. Typically, the chamber manager subroutine 177a includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 3F. The substrate positioning subroutine 180 comprises program code for controlling chamber components that are used to load the substrate onto the susceptor 112, and optionally to lift the substrate to a desired height in the chamber 115 to control the spacing between the substrate and the gas distribution manifold 111. When a substrate is loaded into the process chamber 115, the susceptor 112 is lowered to receive the substrate, and thereafter, the susceptor 112 is raised to the desired height in the chamber, to maintain the substrate at a first distance or spacing from the gas distribution manifold during the CVD process. In operation, the substrate positioning subroutine 180 controls movement of the susceptor in response to process set parameters related to the support height that are transferred from the chamber manager subroutine 177a.

The process gas control subroutine 183 has program code for controlling process gas composition and flow rates. The process gas control subroutine 183 controls the open/close position of the safety shut-off valves, and also ramps up/down the mass flow controllers to obtain the desired gas flow rate. The process gas control subroutine 183 is invoked by the chamber manager subroutine 177a, as are all chamber component subroutines, and receives from the chamber manager subroutine process parameters related to the desired gas flow rates. Typically, the process gas control subroutine 183 operates by opening the gas supply lines, and repeatedly (i) reading the necessary mass flow controllers, (ii) comparing the readings to the desired flow rates received from the chamber manager subroutine 177a, and (iii) adjusting the flow rates of the gas supply lines as necessary. Furthermore, the process gas control subroutine 183 includes steps for monitoring the gas flow rates for unsafe rates, and activating the safety shut-off valves when an unsafe condition is detected.

In some processes, an inert gas such as helium or argon is flowed into the chamber 115 to stabilize the pressure in the chamber before reactive process gases are introduced into the chamber. For these processes, the process gas control subroutine 183 is programmed to include steps for flowing the inert gas into the chamber 115 for an amount of time necessary to stabilize the pressure in the chamber, and then the steps described above would be carried out. Additionally, when a process gas is to be vaporized from a liquid precursor, for example tetraethylorthosilane ("TEOS"), the process gas control subroutine 183 would be written to include steps for bubbling a delivery gas such as helium through the liquid precursor in a bubbler assembly or introducing a carrier gas such as helium to a liquid injection system. When a bubbler is used for this type of process, the process gas control subroutine 183 regulates the flow of the delivery gas, the pressure in the bubbler, and the bubbler temperature in order to obtain the desired process gas flow rates. As discussed above, the desired process gas flow rates are transferred to the process gas control subroutine 183 as process parameters. Furthermore, the process gas control subroutine 183 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 185 comprises program code for controlling the pressure in the chamber 115 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 185 is invoked, the desired, or target, pressure level is received as a parameter from the chamber manager subroutine 177a. The pressure control subroutine 185 operates to measure the pressure in the chamber 115 by reading one or more conventional pressure nanometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 185 can be written to open or close the throttle valve to a particular opening size to regulate the chamber 115 to the desired pressure.

The heater control subroutine 187 comprises program code for controlling the current to heating unit that is used to heat the substrate 120. The heater control subroutine 187 is also invoked by the chamber manager subroutine 177a and receives a target, or setpoint, temperature parameter. The heater control subroutine 187 measures the temperature by measuring voltage output of a thermocouple located in a susceptor 112, compares the measured temperature to the setpoint temperature, and increases or decreases current applied to the heating unit to obtain the setpoint temperature. The temperature is obtained from the measured voltage by looking up the corresponding temperature in a stored conversion table, or by calculating the temperature using a fourth order polynomial. When an embedded loop is used to heat the susceptor 112, the heater control subroutine 187 gradually controls a ramp up/down of current applied to the loop. The gradual ramp up/down increases the life and reliability of the lamp. Additionally, a built-in fail-safe mode can be included to detect process safety compliance, and can shut down operation of the heating unit if the process chamber 115 is not properly set up.

The plasma control subroutine 190 comprises program code for setting low and high frequency the RF power levels applied to the process electrodes in the chamber 115, and to set the low frequency RF frequency employed. Similar to the previously described chamber component subroutines, the plasma control subroutine 190 is invoked by the chamber manager subroutine 177a.

The above reactor description is mainly for illustrative purposes, and other plasma CVD equipment such as electron cyclotron resonance (ECR) plasma CVD devices, induction coupled RF high density plasma CVD devices, or the like may be employed. Additionally, variations of the above described system such as variations in susceptor design, heater design, RF power frequencies, location of RF power connections and others are possible. The present invention is not limited to any specific apparatus or to any specific plasma excitation method.

III. Test Data

To show the effectiveness of the present invention, experiments were performed depositing various silicon oxide films with and without the benefits of the present invention. The results of these experiments are listed below in Table 1.

TABLE 1

FLUORINE INCORPORATION LEVEL

| Chamber Type | Hardware | $NF_3$ Flow (sccm) |
| --- | --- | --- |
| Lamp-Heated | Anodized Faceplate | 0 |
| DxZ | Bare Al Faceplate | 0 |
| DxZ | Anodized Faceplate | 0 |
| DxZ | Bare Al Faceplate | 5 |
| DxZ | Bare Al Faceplate | 15 |

In each experiment, process conditions (except those varies as noted in the table) were kept at the values listed in the exemplary preferred process described above. As evident from these test results adding just a small fluorine flow to the process gas when a bare aluminum faceplate was used with the DxZ chamber resulted in a fluorine content that was slightly higher than that of the silicon oxide film deposited with an anodized aluminum faceplate in the lamp-heated chamber.

The method of the present invention is not intended to be limited by the specific parameters set forth above. Those of ordinary skill in the art will realize that different processing conditions and different reactant sources can be used without departing from the spirit of the invention. Other equivalent or alternative methods of depositing an insulating layer according to the present invention will be apparent to those skilled in the art. For example, the deposition conditions listed above are for exemplary purposes only. Other temperature and pressure levels may be used, other gas flow rates and ratios may be employed and other RF levels may be used. Also, silicon sources other than TEOS may be used and oxygen sources other than $O_2$ may be used.

As another example, the silicon oxide may be used in a layer other than a PMD layer or could be used as a single layer film rather than as one layer of composite film. Also, the silicon oxide layer can be planarized with different methods than described above or it does not need to be planarized at all. If not planarized, it is preferable to deposit the silicon oxide film as a thinner lining layer, for example 1,500 Å thick and then deposit a slightly thicker overlying BPSG layer. The BPSG layer can then be reflowed in an initial planarization step and subsequently subjected to a CMP step to further flatten the film.

In still other examples, sources other than fluorine can be introduced reduce the bulk oxide traps within the silicon oxide film. The only requirement for these sources is that they react with the process chemistry to reduce the source of the oxide trapped charges, e.g., dangling Si—H and H—OH bonds. Thus, sources of other halogen elements such as bromine or chlorine may be used and the inventor discovered that the introduction of a relatively large flow of $N_2O$ (e.g., between about 500–800 sccm) reduces these dangling bonds. It is also possible to introduce the chemical source without flowing a chemical-containing source into the deposition zone during deposition of the silicon oxide film. For example, in some embodiments it may be possible to incorporate a sufficient amount of fluorine or another appropriate element into a seasoning layer deposited within the chamber. Then, during deposition of the silicon oxide layer over the substrate, fluorine from within the seasoning layer may react with the deposition gases to incorporate the desired amount of fluorine within the deposited silicon oxide film. In this embodiment, fluorine may be incorporated into the seasoning film by flowing a fluorine-containing gas into the chamber along with other gases used to deposit the seasoning film (e.g., silicon and oxygen sources). Also, other silicon, oxygen and fluorine sources can be used as substitute sources for those listed above. For example, $CF_4$, $C_2F_6$, $C_3F_8$, $SiF_4$ or $F_2$ among others can be used as the source for additional fluorine to add to the film. These equivalents and alternatives are intended to be included within the scope of the present invention. Other variations will be apparent to persons of skill in the art. Accordingly, it is not intended to limit the invention except as provided in the appended claims.

What is claimed is:

1. A method of processing a plurality of substrates during the manufacture of intergrated circuits, said method comprising:
   (a) forming a plurality of transistors on each of said plurality of substrates;
   (b) transferring a first of said plurality of substrates into a substrate processing chamber having a bare aluminum faceplate and at least one interior chamber wall;
   (c) flowing a process gas comprising a silicon source, an oxygen source and a fluorine source into said substrate processing chamber while maintaining said substrate processing chamber at processing conditions suitable to deposit a silicon oxide layer over the substrate, wherein said fluorine source is flowed into said chamber at a flow rate that results in said silicon oxide layer having a dielectric constant between about 3.9 and 4.2 and in the evorporation of between $1\times10^{19}$ atoms/cm$^3$ and $3\times10^{21}$ atoms/cm$^3$ of fluorine into said silicon oxide layer and said silicon oxide layer is part of a premetal dielectric layer, wherein deposition of said silicon oxide layer over said substrate also results in deposition of silicon oxide on said at least one interior chamber wall;
   (d) transferring said first substrate out of said substrate processing chamber;
   (e) thereafter, flowing a cleaning gas comprising fluorine into said chamber to etch said silicon oxide from said at least one interior chamber wall;
   (f) thereafter, transferring a second of said plurality of substrates into said substrate processing chamber and repeating (c) to deposit a silicon oxide layer over said second substrate, wherein said silicon oxide layer is part of a premetal dielectric layer.

2. The method of claim 1 wherein said fluorine source in (c) is flowed into said chamber at a rate that results in the incorporation of between $1\times10^{20}$ atoms/cm$^3$ and $1\times10^{21}$ atoms/cm$^3$ into said silicon oxide layer.

3. The method of claim 1 wherein said silicon oxide layer in (c) is deposited by a plasma reaction and wherein said silicon source comprises tetraethylorthosilicate.

4. The method of claim 1 wherein said silicon oxide layer in (c) is deposited as one layer of a composite premetal dielectric layer during the fabrication of an integrated circuit comprising a plurality of transistors and wherein properties of said silicon oxide layer determine, at least in part, a breakdown voltage and leakage current of one or more of said transistors.

5. The method of claim 1 wherein said process gas comprises a flow of between 1–30 sccms of said fluorine source.

6. The method of claim 3 wherein said silicon oxide layer is a first layer of a composite premetal dielectric layer.

7. The method of claim 1 wherein a plasma is formed to deposit said silicon oxide film.

8. The method of claim 1 wherein said fluorine level in said silicon oxide layer is between $5\times10^{19}$ atoms/cm$^3$ and $1\times10^{21}$ atoms cm$^3$.

9. The method of claim 1 wherein said process gas consists of tetraethylorthosilicate, said oxygen source, said fluorine source and an inert gas.

10. The method of claim 1 wherein pre-metal silicon oxide layers in (c) are deposited over a plurality of substrates prior to etching silicon deposits from said at least one interior chamber wall in (e).

11. The method of claim 10 whereby said fluorine creates interactions with said silicon oxide layer during deposition of said pre-metal silicon oxide layers to reduce bulk oxide traps within said layers.

12. The method of claim 2 wherein said fluorine source is nitrogen trifluoride.

13. The method of claim 1 further comprising depositing borophosphosilicate glass layers over each of said silicon oxide layers.

14. The method of claim 13 further comprising reflowing said borophosphosilicate glass layers.

15. A method of fabricating an integrated circuit, said method comprising:
   (a) forming transistors upon the surface of a substrate;

(b) after (a) and prior to depositing any metal layers over said substrate, transferring said substrate into a substrate processing chamber that has a bare aluminum faceplate and depositing a first layer of a composite premetal layer dielectric layer over said substrate in said substrate processing chamber from a process gas comprising a silicon source, an oxygen source and a fluorine source, wherein said first layer includes between $1\times10^{19}$ atoms/cm$^3$ and $3\times10^{21}$ atoms/cm$^3$ of fluorine and has a dielectric constant between about 3.9 and 4.2; and (c) after (b) depositing a second layer of said composite premetal layer dielectric layer.

16. The method of claim 15 further comprising completing fabrication of said integrated circuit, wherein said integrated circuit comprises a plurality of transistors and wherein properties of said first layer determine, at least in part, a breakdown voltage and leakage current of one or more of said transistors.

17. The method of claim 16 wherein said silicon source comprises tetraethylorthosilicate.

18. The method of claim 17 wherein said oxygen source is selected from the group of molecular oxygen and nitrous oxide (N$_2$O).

19. The method of claim 18 wherein said fluorine source comprises nitrogen trifluorine.

20. The method of claim 19 wherein said fluorine source is flowed into said deposition zone at a rate of between 1–30 sccm.

21. The method of claim 19 wherein said fluorine source is flowed into said deposition zone at a rate of between 5–20 sccm.

22. The method of claim 20 wherein said second layer of said composite layer comprises borophosphosilicate glass.

23. The method of claim 15 wherein a fluorine content of said first layer is between about $1\times10^{20}$ atoms/cm$^3$ and $1\times10^{21}$ atoms/cm$^3$.

24. The method of claim 15 further comprising reflowing said premetal dielectric layer after said second layer is deposited.

25. A method of fabricating an integrated circuit, said method comprising:

(a) forming transistors upon the surface of a substrate;

(b) after (a) and prior to depositing any metal layers over said substrate, transferring said substrate into a substrate processing chamber that has a bare aluminum faceplate and forming a plasma within said substrate processing chamber from a process gas comprising a tetraethylorthosilicate, an oxygen source and a fluorine source to deposit a first layer of a composite layer dielectric layer over said substrate, said process gas comprising a selected amount of said fluorine source to incorporate between about $5\times10^{19}$ atoms/cm$^3$ and $1\times10^{21}$ atoms/cm$^3$ of fluorine into said first layer, and said first layer being deposited to a thickness of between about 5,000 Å and 12,000 Å; and (c) after (b), depositing a photoresist layer over said first layer and then etching back said photoresist layer and first layer so that said first layer is between about 2,000 and 4,000 Å thick;

(d) after (c), depositing a second layer of said composite layer over said first layer, said second layer comprising borophosphosilicate glass.

26. A method of fabricating an integrated circuit, said method comprising:

(a) forming a plurality of transistors upon the surface of a substrate, each of said plurality of transistors including a source, a drain and a gate;

(b) after forming said plurality of transistors and prior to depositing any metal layers over said substrate, transferring said substrate into a substrate processing chamber that has a bare aluminum faceplate and forming a plasma within said chamber from a process gas comprising tetraethylorthosilicate, an oxygen source and a fluorine source to deposit a first layer of a composite layer dielectric layer over said substrate, wherein a flow rate of said fluorine source in said process gas is selected to incorporate between about $5\times10^{19}$ atoms/cm$^3$ and $1\times10^{21}$ atoms/cm$^3$ of fluorine into said first layer, and wherein said first layer is deposited to a first thickness;

(c) after depositing said first layer, depositing a photoresist layer over said first layer and then etching back said photoresist layer and first layer so that said first layer has a second thickness that is less than said first thickness.

27. The method of claim 26 wherein said first thickness is between about 5,000 Å and 12,000 Å.

28. The method of claim 26 further comprising, after etching back said photoresist layer and said first layer, depositing a second layer of said composite layer over said first layer, said second layer comprising borophosphosilicate glass.

29. The method of claim 26 wherein said second thickness is between 2000 Å and 4000 Å.

30. The method of claim 27 wherein said process gas consists of said silicon source, said oxygen source, said fluorine-containing source and an inert gas.

31. The method of claim 28 wherein said second layer comprises borophosphosilicate glass.

32. A method of fabricating an integrated circuit, said method comprising:

(a) forming a plurality of transistors upon the surface of a substrate, each of said plurality of transistors including a source, a drain and a gate;

(b) after forming said plurality of transistors and prior to depositing any metal layers over said substrate, transferring said substrate into a substrate processing chamber that has a bare aluminum faceplate and forming a plasma within said chamber from a process gas comprising tetraethylorthosilicate, an oxygen source and a fluorine source to deposit a first layer of a composite layer dielectric layer over said substrate, wherein said first layer has a dielectric constant of between about 3.9 and 4.2.

33. The method of claim 32 wherein said first layer is deposited to a first thickness and further comprising:

(c) after depositing said first layer, depositing a photoresist layer over said first layer and then etching back said photoresist layer and first layer so that said first layer has a second thickness that is less than said first thickness.

34. The method of claim 33 further comprising, after etching back said photoresist layer and said first layer, depositing a second layer of said composite layer over said first layer, said second layer comprising borophosphosilicate glass.

35. The method of claim 34 wherein said first thickness is between about 5,000 Å and 12,000 Å.

36. The method of claim 35 wherein said second thickness is between 2000 Å and 4000 Å.

* * * * *